(12) United States Patent
Shinozaki

(10) Patent No.: US 12,074,620 B2
(45) Date of Patent: *Aug. 27, 2024

(54) HIGH-FREQUENCY MODULE AND COMMUNICATION DEVICE

(71) Applicant: Murata Manufacturing Co., Ltd., Nagaokakyo (JP)

(72) Inventor: Takayuki Shinozaki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/301,990

(22) Filed: Apr. 18, 2023

(65) Prior Publication Data

US 2023/0253993 A1    Aug. 10, 2023

Related U.S. Application Data

(63) Continuation of application No. 17/685,390, filed on Mar. 3, 2022, now Pat. No. 11,658,691, which is a
(Continued)

(30) Foreign Application Priority Data

Sep. 6, 2019 (JP) ................................. 2019-163392

(51) Int. Cl.
    *H04B 1/04* (2006.01)
    *H04B 1/03* (2006.01)
    *H04B 1/08* (2006.01)

(52) U.S. Cl.
    CPC ................ *H04B 1/04* (2013.01); *H04B 1/03* (2013.01); *H04B 1/08* (2013.01); *H04B 2001/0408* (2013.01)

(58) Field of Classification Search
    CPC . H01L 2224/16225; H01L 2224/16235; H01L 2924/181; H01L 2924/18161;
    (Continued)

(56) References Cited

U.S. PATENT DOCUMENTS 10,158,330 B1    12/2018 Khlat
10,340,863 B2 *   7/2019 Okabe ..................... H03F 3/195
(Continued)

FOREIGN PATENT DOCUMENTS

JP    2012-89549 A     5/2012
JP    2015-201538 A   11/2015
(Continued)

OTHER PUBLICATIONS

International Search Report and Written Opinion mailed on Sep. 8, 2020, received for PCT Application PCT/JP2020/023117, Filed on Jun. 11, 2020, 8 pages including English Translation.
(Continued)

*Primary Examiner* — Andrew Wendell
(74) *Attorney, Agent, or Firm* — XSENSUS LLP

(57) ABSTRACT

A high-frequency module includes an antenna terminal and an input terminal. A second switch is connected between the antenna terminal and the input terminal, and a power amplifier is connected between the second switch and the input terminal. A mounting substrate has a first main surface and a second main surface on opposite sides of the mounting surface. The power amplifier includes a driver stage amplifier and an output stage amplifier. The driver stage amplifier and the second switch are arranged on the second main surface of the mounting substrate, and the output stage amplifier is arranged on the first main surface of the mounting substrate. The driver stage amplifier and the second switch are included in one semiconductor chip.

20 Claims, 7 Drawing Sheets

Related U.S. Application Data continuation of application No. PCT/JP2020/023117, filed on Jun. 11, 2020.

(58) Field of Classification Search
CPC ........... H01L 2924/19105; H01L 23/12; H01L 23/36; H01L 25/04; H01L 25/065; H01L 25/07; H01L 25/18; H04B 1/04; H04B 1/03; H04B 1/08; H04B 2001/0408; H04B 1/38; H04B 1/16; H04B 1/40; H04M 1/02

See application file for complete search history.

(56) References Cited

U.S. PATENT DOCUMENTS

| | | | |
|---|---|---|---|
| 10,404,219 B2 | 9/2019 | Wallis | |
| 10,911,008 B2 * | 2/2021 | Okabe | H03F 3/68 |
| 11,509,271 B2 * | 11/2022 | Okabe | H03F 3/245 |
| 11,658,691 B2 * | 5/2023 | Shinozaki | H01L 23/12 |
| | | | 455/552.1 |
| 11,881,822 B2 * | 1/2024 | Okabe | H03F 3/195 |
| 2004/0065462 A1 | 4/2004 | Hayashi | |
| 2005/0067716 A1 | 3/2005 | Mishra et al. | |
| 2009/0195334 A1 | 8/2009 | Goi et al. | |
| 2016/0093577 A1 | 3/2016 | Chen et al. | |
| 2018/0083583 A1 | 3/2018 | Tsutsui et al. | |
| 2018/0130761 A1 | 5/2018 | Kim et al. | |
| 2018/0294783 A1 | 10/2018 | Okabe | |
| 2019/0028064 A1 | 1/2019 | Lee et al. | |
| 2019/0173439 A1 | 6/2019 | Dunworth et al. | |
| 2020/0169223 A1 | 5/2020 | Leipold et al. | |

FOREIGN PATENT DOCUMENTS

| | | |
|---|---|---|
| JP | 2018-181943 A | 11/2018 |
| WO | 2018/150724 A1 | 8/2018 |
| WO | 2019/065311 A1 | 4/2019 |
| WO | 2019/065419 A1 | 4/2019 |

OTHER PUBLICATIONS

English translation of the Written Opinion mailed on Sep. 8, 2020, received for PCT Application PCT/JP2020/023117.

* cited by examiner

HIGH-FREQUENCY MODULE AND COMMUNICATION DEVICE

CROSS REFERENCE TO RELATED APPLICATIONS

The present application is a continuation of U.S. patent application Ser. No. 17/685,390, filed Mar. 3, 2022, which is a continuation of International Patent Application No. PCT/JP2020/023117, filed Jun. 11, 2020, which claims priority to Japanese Patent Application No. JP 2019-163392, filed Sep. 6, 2019, the entire contents of each of which being incorporated herein by reference.

TECHNICAL FIELD

The present disclosure relates generally to a high-frequency module and a communication device, and more particularly to a high-frequency module including a power amplifier and a communication device including the high-frequency module. The term "high-frequency" as used herein is not limited to the HF frequency band and should be construed more generally as Radio Frequency (RF), and including frequencies inclusive of the band from 450 MHz through 53 GHz.

BACKGROUND ART

A power amplification module including a driver stage amplifier, an output stage amplifier, an inter-stage matching circuit, an output matching circuit, and a control circuit (controller) has been known (for example, see Patent Document 1). The power amplification module is a high-frequency module that amplifies the power of an input signal to a level required for transmission to a base station in a mobile communication terminal such as a cellular phone.

The control circuit controls the operation of the driver stage amplifier and the output stage amplifier.

Components such as the driver stage amplifier, the output stage amplifier, the inter-stage matching circuit, the output matching circuit, and the control circuit of the power amplification module are arranged on a mounting substrate. The driver stage amplifier and the output stage amplifier are integrated on a single IC chip.

CITATION LIST

Patent Document

Patent Document 1: Japanese Unexamined Patent Application Publication No. 2018-181943

SUMMARY

Technical Problems

In a high-frequency module such as the high-frequency module disclosed in Patent Document 1, miniaturization may be desired.

It is an aspect of the present disclosure to provide a high-frequency module and a communication device that can be reduced in size.

Solutions to Problems

A high-frequency module according to one aspect of the present disclosure includes an antenna terminal and an input terminal. A second switch is connected between the antenna terminal and the input terminal, and a power amplifier is connected between the second switch and the input terminal. A mounting substrate has a first main surface and a second main surface on opposite sides of the mounting surface. The power amplifier includes a driver stage amplifier and an output stage amplifier. The driver stage amplifier and the second switch are arranged in the second main surface of the mounting substrate, and the output stage amplifier is arranged on the first main surface of the mounting substrate. The driver stage amplifier and the second switch are included in one semiconductor chip.

A communication device according to an aspect of the present disclosure includes a signal processing circuit and the high-frequency module. The power amplifier of the high-frequency module amplifies and outputs a transmission signal from the signal processing circuit.

Advantageous Effects of Disclosure

The high-frequency module and the communication device according to the above aspects of the present disclosure can be reduced in size.

DESCRIPTION OF EMBODIMENTS

Figure 1:
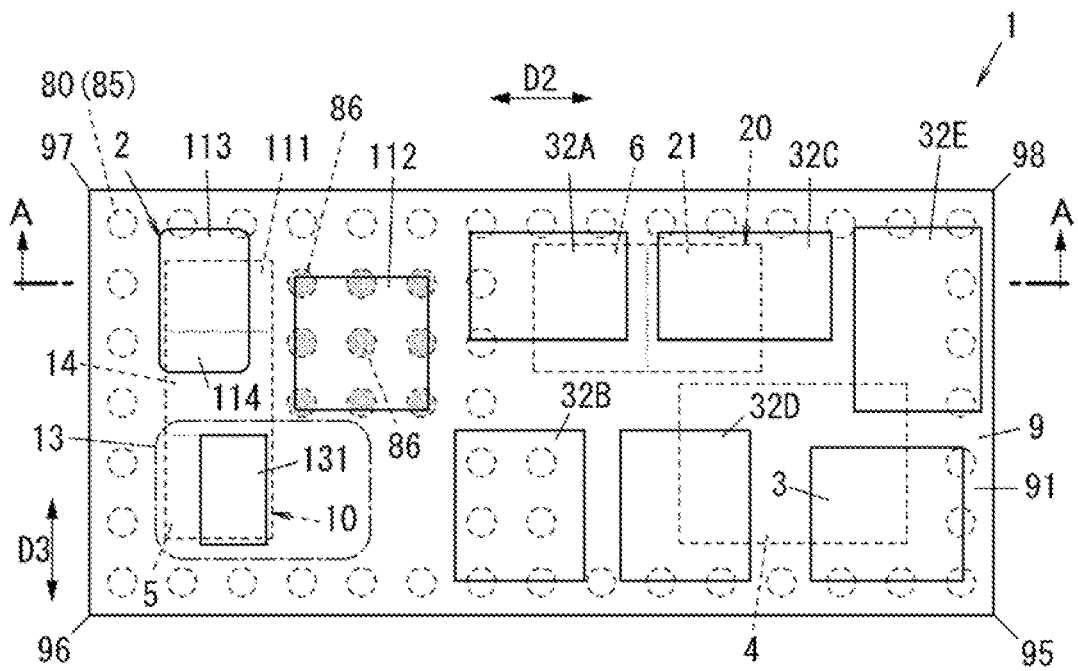
FIG. 1 is a plan view of a high-frequency module according to Embodiment 1.

FIGS. 1 to 3 and 5 to 11 that are referred to in the following embodiments and the like are schematic diagrams, and ratios of sizes and thicknesses of respective components in the drawings do not necessarily reflect actual dimensional ratios.

Embodiment 1

Hereinafter, a high-frequency module 1 and a communication device 300 according to Embodiment 1 will be described with reference to FIGS. 1 to 4.

(1) High-Frequency Module and Communication Device

(1.1) Circuit Configuration of High-Frequency Module and Communication Device Circuit configurations of the high-frequency module 1 and the communication device 300 according to Embodiment 1 will be described with reference to FIG. 4.

The high-frequency module 1 according to Embodiment 1 is used in, for example, the communication device 300. The communication device 300 is, for example, a cellular phone (for example, a smartphone), but is not limited thereto, and may be, for example, a wearable terminal (for example, a smart watch) or the like. The high-frequency module 1 is a module compatible with, for example, the 4G (fourth generation mobile communication) standard, the 5G (fifth generation mobile communication) standard, or the like. The 4G standard is, for example, the 3GPP LTE (Long Term Evolution) standard. The 5G standard is, for example, 5G NR (New Radio). The high-frequency module 1 is a module capable of supporting carrier aggregation and dual connectivity.

For example, the high-frequency module 1 is configured to amplify a transmission signal input from a signal processing circuit 301 and output the amplified transmission signal to an antenna 310. Further, the high-frequency module 1 is configured to amplify a reception signal input from the antenna 310 and output the amplified reception signal to the signal processing circuit 301. The signal processing circuit 301 is not a component of the high-frequency module 1 but a component of the communication device 300 including the high-frequency module 1. The high-frequency module 1 according to Embodiment 1 is controlled by, for example, the signal processing circuit 301 included in the communication device 300. The communication device 300 includes the high-frequency module 1 and the signal processing circuit 301. The communication device 300 further includes the antenna 310. The communication device 300 further includes a circuit board on which the high-frequency module 1 is mounted. The circuit board is, for example, a printed wiring board. The circuit board has a ground electrode to which a ground potential is applied.

The signal processing circuit 301 includes, for example, an RF signal processing circuit 302 and a baseband signal processing circuit 303. The RF signal processing circuit 302 is, for example, a radio frequency integrated circuit (RFIC) and performs signal processing on a high-frequency signal. For example, the RF signal processing circuit 302 performs signal processing such as up-conversion on a high-frequency signal (transmission signal) output from the baseband signal processing circuit 303, and outputs the high-frequency signal subjected to the signal processing. Further, for example, the RF signal processing circuit 302 performs signal processing such as down-conversion on a high-frequency signal (reception signal) output from the high-frequency module 1, and outputs the high-frequency signal subjected to the signal processing to the baseband signal processing circuit 303. The baseband signal processing circuit 303 is, for example, a baseband integrated circuit (BBIC). The baseband signal processing circuit 303 generates an I-phase signal and a Q-phase signal from the baseband signal. The baseband signal is, for example, an audio signal, an image signal, or the like input from outside. The baseband signal processing circuit 303 performs IQ modulation processing by combining the I-phase signal and the Q-phase signal, and outputs a transmission signal. At this time, the transmission signal is generated as a modulated signal (IQ signal) obtained by amplitude-modulating a carrier signal having a predetermined frequency with a period longer than the period of the carrier signal. The reception signal processed by the baseband signal processing circuit 303 is used, for example, for image display as an image signal or for a call as an audio signal. The high-frequency module 1 transmits a high-frequency signal (reception signal, transmission signal) between the antenna 310 and the RF signal processing circuit 302 of the signal processing circuit 301.

The high-frequency module 1 according to Embodiment 1 includes a power amplifier 11 and a controller 14. In addition, the high-frequency module 1 further includes a low noise amplifier 21 and five duplexers 32A, 32B, 32C, 32D, and 32E. The duplexer 32A includes a transmission filter 12A and a reception filter 22A. The duplexer 32B includes a transmission filter 12B and a reception filter 22B. The duplexer 32C includes a transmission filter 12C and a reception filter 22C. The duplexer 32D includes a transmission filter 12D and a reception filter 22D. The duplexer 32E includes a transmission filter 12E and a reception filter 22E. In addition, the high-frequency module 1 further includes a switch 4 (hereinafter also referred to as a first switch 4), a switch 5 (hereinafter also referred to as a second switch 5), and a switch 6 (hereinafter also referred to as a third switch 6). In addition, the high-frequency module 1 further includes an output matching circuit 13. In addition, the high-frequency module 1 further includes a low pass filter 3. In addition, although not illustrated, the high-frequency module 1 further includes a plurality of matching circuits, one of which is provided in each signal path between each of the five duplexers 32A to 32E and the first switch 4. Each of the plurality of matching circuits is a circuit for impedance matching between the antenna 310 and the first switch 4 connected to an antenna terminal 81 and a corresponding duplexer among the plurality of duplexers 32A to 32E. Each of the plurality of matching circuits is formed by, for example, one inductor, but is not limited thereto, and may include, for example, a plurality of inductors and a plurality of capacitors.

In addition, the high-frequency module 1 also includes a plurality of external connection terminals 80. The plurality of external connection terminals 80 includes the antenna terminal 81, a signal input terminal 82, a signal output terminal 83, a plurality of control terminals 84, and a plurality of ground terminals 85 (see FIG. 2 and FIG. 3). The plurality of ground terminals 85 is a terminal that is electrically connected to the ground electrode of the above-described circuit board included in the communication device 300 and is supplied with a ground potential. In addition, the plurality of external connection terminals 80 includes a first power supply terminal Vcc1 and a second power supply terminal Vcc2.

The power amplifier 11 is provided in a signal path Tx' for transmission signals. The power amplifier 11 amplifies and outputs, for example, a transmission signal from the signal processing circuit 301. The power amplifier 11 amplifies and outputs an input transmission signal in a predetermined frequency band. Here, the predetermined frequency band includes, for example, a first communication band, a second communication band, a third communication band, a fourth communication band, and a fifth communication band. The first communication band corresponds to transmission signals that pass through the transmission filter 12A. The second communication band corresponds to transmission signals that pass through the transmission filter 12B. The third communication band corresponds to transmission signals that pass through the transmission filter 12C. The fourth communication band corresponds to transmission signals that pass through the transmission filter 12D. The fifth communication band corresponds to transmission signals that pass through the transmission filter 12E.

The power amplifier 11 includes a driver stage amplifier 111, an output stage amplifier 112, and an inter-stage matching circuit 113. The output stage amplifier 112 is connected in series to the output side of the driver stage amplifier 111. The amplification factor of the driver stage amplifier 111 is smaller than the amplification factor of the output stage amplifier 112. The inter-stage matching circuit 113 is connected between the driver stage amplifier 111 and the output stage amplifier 112. The inter-stage matching circuit 113 matches impedances between the driver stage amplifier 111 and the output stage amplifier 112. The inter-stage matching circuit 113 includes a circuit element 114. The circuit element 114 is, for example, an inductor provided between the driver stage amplifier 111 and the output stage amplifier 112. The inductor is, for example, a chip inductor. The inter-stage matching circuit 113 may further include a capacitor in addition to the inductor.

In the power amplifier 11, an input terminal of the driver stage amplifier 111 is connected to the signal input terminal 82. The input terminal of the driver stage amplifier 111 is connected to the signal processing circuit 301 via the signal input terminal 82. The signal input terminal 82 is a terminal for inputting a high-frequency signal (transmission signal) from an external circuit (for example, the signal processing circuit 301) to the high-frequency module 1. In the power amplifier 11, an output terminal of the output stage amplifier 112 is connected to a common terminal 50 of the second switch 5 via the output matching circuit 13. The power amplifier 11 is controlled by the controller 14.

The controller 14 is connected to the driver stage amplifier 111 and the output stage amplifier 112 of the power amplifier 11. The controller 14 is connected to the signal processing circuit 301 via the plurality of (for example, four) control terminals 84. The plurality of control terminals 84 is a terminal for inputting a control signal from an external circuit (for example, the signal processing circuit 301) to the controller 14. The controller 14 controls the power amplifier 11 based on the control signal acquired from the plurality of control terminals 84. The plurality of control terminals 84 corresponds to, for example, the MIPI (Mobile Industry Processor Interface) standard. The controller 14 has a plurality of terminals 148 connected to the plurality of control terminals 84 as an input unit to which a control signal is input. The plurality of terminals 148 is compliant with, for example, the MIPI standard. The controller 14 controls the power amplifier 11 in accordance with a control signal from the RF signal processing circuit 302. The controller 14 receives the control signal from the RF signal processing circuit 302 at the plurality of terminals 148, and supplies, for example, a first bias current to the driver stage amplifier 111 and a second bias current to the output stage amplifier 112 in accordance with the control signal. In addition, although not illustrated, the controller 14 is also connected to the first switch 4 and the second switch 5, and controls the first switch 4 and the second switch 5 based on the above-described control signal.

The power amplifier 11 performs an envelope tracking operation. The power amplifier 11 is controlled by a control circuit (not illustrated) to perform an envelope tracking operation. The control circuit controls a power supply voltage of the power amplifier 11 in accordance with an input signal level of a transmission signal (a transmission signal from the signal processing circuit 301) input to the power amplifier 11. More specifically, in the high-frequency module 1, the first power supply terminal Vcc1 for supplying power to the driver stage amplifier 111 and the second power supply terminal Vcc2 for supplying power to the output stage amplifier 112 are supplied with a first power supply voltage and a second power supply voltage, respectively, corresponding to an amplitude level of the transmission signal. The control circuit is supplied with power from, for example, a battery of the communication device 300. The control circuit generates, for example, a first power supply voltage and a second power supply voltage based on a power supply control signal (envelope signal) from the baseband signal processing circuit 303 of the signal processing circuit 301, and supplies the first power supply voltage and the second power supply voltage to the first power supply terminal Vcc1 and the second power supply terminal Vcc2, respectively. The baseband signal processing circuit 303 detects the amplitude level of the modulation signal based on the IQ signal, and outputs a power supply control signal to the control circuit so that the first power supply voltage and the second power supply voltage become levels corresponding to the amplitude level of the transmission signal.

The low noise amplifier 21 has an input terminal and an output terminal. The low noise amplifier 21 is provided in a signal path Rx1 for reception signals. The low noise amplifier 21 amplifies the reception signal of the predetermined frequency band input to the input terminal and outputs the amplified signal from the output terminal. The input terminal of the low noise amplifier 21 is connected to a common terminal 60 of the third switch 6. An input matching circuit may be provided between the input terminal of the low noise amplifier 21 and the common terminal 60 of the third switch 6. The output terminal of the low noise amplifier 21 is connected to the signal output terminal 83. The output terminal of the low noise amplifier 21 is connected to, for example, the signal processing circuit 301 via the signal output terminal 83. The signal output terminal 83 is a terminal for outputting a high-frequency signal (reception signal) from the low noise amplifier 21 to an external circuit (for example, the signal processing circuit 301).

The transmission filter 12A is, for example, a filter whose pass band is a transmission band of the first communication band. The transmission filter 12B is, for example, a filter whose pass band is the transmission band of the second communication band. The transmission filter 12C is, for example, a filter whose pass band is the transmission band of the third communication band. The transmission filter 12D is, for example, a filter whose pass band is the transmission band of the fourth communication band. The transmission filter 12E is, for example, a filter whose pass band is the transmission band of the fifth communication band. The reception filter 22A is, for example, a filter whose pass band is a reception band of the first communication band. The reception filter 22B is, for example, a filter whose pass band is the reception band of the second communication band. The reception filter 22C is, for example, a filter whose pass band is the reception band of the third communication band. The reception filter 22D is, for example, a filter whose pass band is the reception band of the fourth communication band. The reception filter 22E is, for example, a filter whose pass band is the reception band of the fifth communication band.

The first switch 4 includes a common terminal 40 and five selection terminals 41 to 45. The first switch 4 is an antenna switch connected to the antenna terminal 81. In the first switch 4, the common terminal 40 is connected to the antenna terminal 81. More specifically, the common terminal 40 is connected to the antenna terminal 81 via the low pass filter 3. The antenna 310 is connected to the antenna terminal 81. The selection terminal 41 is connected to a connection point between an output terminal of the transmission filter 12A and an input terminal of the reception filter 22A. The selection terminal 42 is connected to a connection point between an output terminal of the transmission filter 12B and an input terminal of the reception filter 22B. The selection terminal 43 is connected to a connection point between an output terminal of the transmission filter 12C and an input terminal of the reception filter 22C. The selection terminal 44 is connected to a connection point between an output terminal of the transmission filter 12D and an input terminal of the reception filter 22D. The selection terminal 45 is connected to a connection point between an output terminal of the transmission filter 12E and an input terminal of the reception filter 22E. The first switch 4 is, for example, a switch capable of connecting at least one or more of the five selection terminals 41 to 45 to the common terminal 40. Here, the first switch 4 is, for example, a switch capable of one-to-one and one-to-many connection.

The first switch 4 is controlled by, for example, the controller 14. For example, the first switch 4 switches the connection state between the common terminal 40 and the five selection terminals 41 to 45 in accordance with a control signal from the controller 14. The first switch 4 is, for example, a switch IC (Integrated Circuit).

The second switch 5 includes the common terminal 50 and five selection terminals 51 to 55. The common terminal 50 is connected to the output terminal of the output stage amplifier 112 via the output matching circuit 13. The selection terminal 51 is connected to an input terminal of the transmission filter 12A (a transmission terminal of the duplexer 32A). The selection terminal 52 is connected to an input terminal of the transmission filter 12B (a transmission terminal of the duplexer 32B). The selection terminal 53 is connected to an input terminal of the transmission filter 12C (a transmission terminal of the duplexer 32C). The selection terminal 54 is connected to an input terminal of the transmission filter 12D (a transmission terminal of the duplexer 32D). The selection terminal 55 is connected to an input terminal of the transmission filter 12E (a transmission terminal of the duplexer 32E). For example, the second switch 5 is a switch capable of connecting at least one or more of the five selection terminals 51 to 55 to the common terminal 50. Here, the second switch 5 is, for example, a switch capable of one-to-one and one-to-many connection. The second switch 5 is a band select switch having a function of switching signal paths for a plurality of transmission signals in different communication bands.

The second switch 5 is controlled by, for example, the controller 14. For example, the second switch 5 switches the connection state between the common terminal 50 and the five selection terminals 51 to 55 in accordance with a control signal from the controller 14. The second switch 5 is, for example, a switch IC.

The third switch 6 includes the common terminal 60 and five selection terminals 61 to 65. The common terminal 60 is connected to the input terminal of the low noise amplifier 21. The selection terminal 61 is connected to an output terminal of the reception filter 22A (a reception terminal of the duplexer 32A). The selection terminal 62 is connected to an output terminal of the reception filter 22B (a reception terminal of the duplexer 32B). The selection terminal 63 is connected to an output terminal of the reception filter 22C (a reception terminal of the duplexer 32C). The selection terminal 64 is connected to an output terminal of the reception filter 22D (a reception terminal of the duplexer 32D). The selection terminal 65 is connected to an output terminal of the reception filter 22E (a reception terminal of the duplexer 32E). The third switch 6 is, for example, a switch capable of connecting at least one or more of the five selection terminals 61 to 65 to the common terminal 60. Here, the third switch 6 is, for example, a switch capable of one-to-one and one-to-many connection.

The third switch 6 is controlled by the controller 14, for example. For example, the third switch 6 switches the connection state between the common terminal 60 and the five selection terminals 61 to 65 in accordance with a control signal from the controller 14. The third switch 6 is, for example, a switch IC.

The output matching circuit 13 is provided in a signal path between the output terminal of the output stage amplifier 112 of the power amplifier 11 and the common terminal 50 of the second switch 5. The output matching circuit 13 is a circuit for impedance matching between the output stage amplifier 112 and the transmission filters 12A to 12E. The output matching circuit 13 is formed by, for example, one circuit element 131 (here, an inductor), but is not limited thereto, and may include, for example, a plurality of inductors and a plurality of capacitors.

In addition, although not illustrated, the high-frequency module 1 includes an input matching circuit. The input matching circuit is provided in a signal path between the input terminal of the low noise amplifier 21 and the common terminal 60 of the third switch 6. The input matching circuit is a circuit for impedance matching between the low noise amplifier 21 and the reception filters 22A to 22E. The input matching circuit is formed by, for example, one inductor, but is not limited thereto, and may include, for example, a plurality of inductors and a plurality of capacitors.

(1.2) Structure of High-Frequency Module

Figure 2:
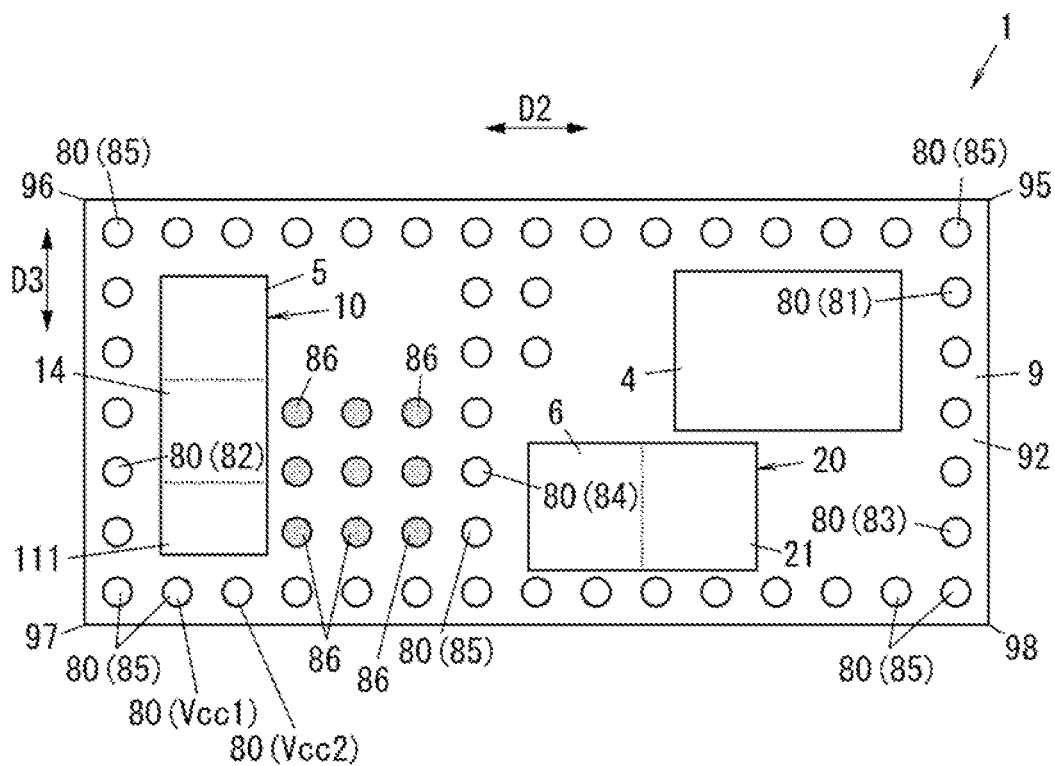
FIG. 2 is a bottom view of the above high-frequency module.
Figure 3:
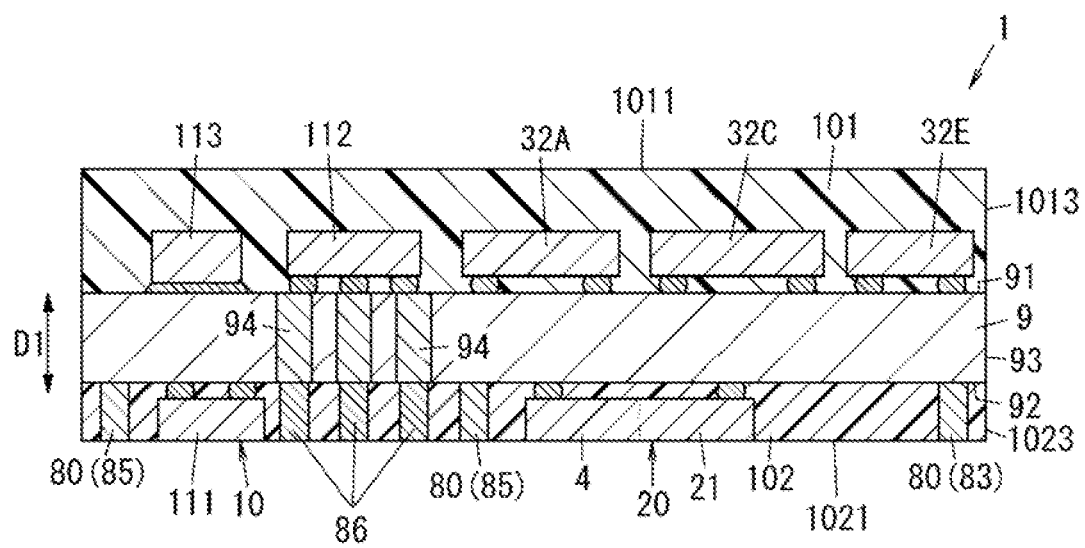
FIG. 3 is a cross-sectional view illustrating the above high-frequency module taken along a line A-A of FIG. 1.

Hereinafter, the structure of the high-frequency module 1 will be described with reference to FIGS. 1 to 3.

The high-frequency module 1 includes a mounting substrate 9 and the power amplifier 11.

The mounting substrate 9 has a first main surface 91 and a second main surface 92 that face each other in a thickness direction D1 of the mounting substrate 9. The mounting substrate 9 is, for example, a printed wiring board, an LTCC (Low Temperature Co-fired Ceramics) substrate, an HTCC (High Temperature Co-fired Ceramics) substrate, or a resin multilayer substrate. Here, the mounting substrate 9 is, for example, a multilayer substrate including a plurality of dielectric layers and a plurality of conductive layers. The plurality of dielectric layers and the plurality of conductive layers are stacked in the thickness direction D1 of the mounting substrate 9. The plurality of conductive layers is formed in a predetermined pattern determined for each layer. Each of the plurality of conductive layers includes one or a plurality of conductor portions in one plane orthogonal to the thickness direction D1 of the mounting substrate 9. The material of each conductive layer is, for example, copper. The plurality of conductive layers includes a ground layer. In the high-frequency module 1, the plurality of ground terminals 85 and the ground layer are electrically connected to each other via a via conductor or the like included in the mounting substrate 9.

The mounting substrate 9 is not limited to a printed wiring board or an LTCC substrate, and may be a wiring structure. The wiring structure is, for example, a multilayer structure. The multilayer structure includes at least one insulating layer and at least one conductive layer. The insulating layer is formed in a predetermined pattern. When a plurality of insulating layers is provided, the plurality of insulating layers is formed in a predetermined pattern determined for each layer. The conductive layer is formed in a predetermined pattern different from the predetermined pattern of the insulating layer. When a plurality of conductive layers is provided, the plurality of conductive layers is formed in a predetermined pattern determined for each layer. The conductive layer may include one or more redistribution portions. In the wiring structure, of two surfaces facing each other in the thickness direction of the multilayer structure, a first surface is the first main surface 91 of the mounting substrate 9, and a second surface is the second main surface 92 of the mounting substrate 9. The wiring structure may be, for example, an interposer. The interposer may be an interposer using a silicon substrate, or may be a substrate formed of multiple layers.

The first main surface 91 and the second main surface 92 of the mounting substrate 9 are separated from each other in the thickness direction D1 of the mounting substrate 9, and intersect with the thickness direction D1 of the mounting substrate 9. The first main surface 91 of the mounting substrate 9 is, for example, orthogonal to the thickness direction D1 of the mounting substrate 9, but may include, for example, a side surface of a conductor portion, or the like as a surface that is not orthogonal to the thickness direction D1. In addition, the second main surface 92 of the mounting substrate 9 is, for example, orthogonal to the thickness direction D1 of the mounting substrate 9, but may include, for example, a side surface of the conductor portion, or the like as a surface that is not orthogonal to the thickness direction D1. In addition, the first main surface 91 and the second main surface 92 of the mounting substrate 9 may be formed with fine irregularities, concave portions, or convex portions. In a plan view from the thickness direction D1 of the mounting substrate 9, the mounting substrate 9 has a rectangular shape, but is not limited thereto, and may have, for example, a square shape.

The high-frequency module 1 includes the above-described power amplifier 11, the controller 14, the low noise amplifier 21, the five duplexers 32A to 32E, the first switch 4, the second switch 5, the third switch 6, the output matching circuit 13, the input matching circuit, five matching circuits provided between the five duplexers 32A to 32E and the first switch 4, and the low pass filter 3 as a plurality of circuit elements. The plurality of circuit elements of the high-frequency module 1 is mounted on the mounting substrate 9. Here, "is mounted" includes arranging (mechanically connecting) the circuit element on the mounting substrate 9 and electrically connecting the circuit element to (an appropriate conductor portion of) the mounting substrate 9. The plurality of circuit elements is not limited to electronic components mounted on the mounting substrate 9, and may include circuit elements provided in the mounting substrate 9.

In the high-frequency module 1 according to Embodiment 1, the output stage amplifier 112 and the driver stage amplifier 111 of the power amplifier 11 are configured by different IC chips. In the high-frequency module 1 according to Embodiment 1, the output stage amplifier 112 is mounted on the first main surface 91 of the mounting substrate 9. Therefore, the output stage amplifier 112 is arranged on the first main surface 91 of the mounting substrate 9. In addition, the high-frequency module 1, the first switch 4 is mounted on the second main surface 92 of the mounting substrate 9. Therefore, the first switch 4 is arranged on the second main surface 92 of the mounting substrate 9. In the high-frequency module 1 according to Embodiment 1, an IC chip 10, which is a semiconductor chip including the driver stage amplifier 111, the controller 14, and the second switch 5, is mounted on the second main surface 92 of the mounting substrate 9. Therefore, the IC chip 10 is arranged on the second main surface 92 of the mounting substrate 9. In addition, in the high-frequency module 1 according to Embodiment 1, an IC chip 20 obtained by integrating the third switch 6 and the low noise amplifier 21 into one chip is mounted on the second main surface 92 of the mounting substrate 9. Therefore, the IC chip 20 is arranged on the second main surface 92 of the mounting substrate 9.

In the high-frequency module 1, the output stage amplifier 112 is an IC chip including a substrate and an IC unit including at least one transistor formed on the substrate. The substrate is, for example, a gallium arsenide substrate. The IC unit has a function of amplifying the transmission signal input to the input terminal of the output stage amplifier 112. The transistor is, for example, a heterojunction bipolar transistor (HBT). The output stage amplifier 112 may include, for example, a capacitor for cutting direct current. The IC chip configuring the output stage amplifier 112 is flip-chip mounted on the first main surface 91 of the mounting substrate 9. In a plan view from the thickness direction D1 of the mounting substrate 9, the outer peripheral shape of the output stage amplifier 112 is a quadrangular shape.

In the high-frequency module 1, the IC chip 10 has a substrate, a first circuit portion as the driver stage amplifier 111 formed on the substrate, a second circuit portion as the controller 14 formed on the substrate, and a third circuit portion as the second switch 5 formed on the substrate. The substrate is, for example, a silicon substrate. The first circuit portion includes a transistor and has a function of the driver stage amplifier 111 that amplifies and outputs an input transmission signal. The transistor included in the first circuit portion is, for example, a bipolar transistor. The second circuit portion has a function of the controller 14 that controls the power amplifier 11, the first switch 4, and the second switch 5. The third circuit portion includes the common terminal 50 of the second switch 5, the five selection terminals 51 to 55, and a plurality of field effect transistors (FETs).

The IC chip 10 is flip-chip mounted on the second main surface 92 of the mounting substrate 9. In a plan view from the thickness direction D1 of the mounting substrate 9, the outer peripheral shape of the IC chip 10 is a quadrangular shape.

In the high-frequency module 1, the IC chip 20 including the third switch 6 and the low noise amplifier 21 includes a substrate, a first circuit portion as the third switch 6 formed on the substrate, and a second circuit portion as the low noise amplifier 21 formed on the substrate. The substrate is, for example, a silicon substrate. The first circuit portion includes the common terminal 60 of the third switch 6, the six selection terminals 61 to 65, and a plurality of FETs. The second circuit portion has a function of amplifying and outputting an input reception signal. The IC chip 20 is flip-chip mounted on the second main surface 92 of the mounting substrate 9. In a plan view from the thickness direction D1 of the mounting substrate 9, the outer peripheral shape of the IC chip 20 is a quadrangular shape.

Each of the five duplexers 32A to 32E is, for example, a bare chip duplexer. As described above, the duplexer 32A includes the transmission filter 12A and the reception filter 22A. The duplexer 32B includes the transmission filter 12B and the reception filter 22B. The duplexer 32C includes the transmission filter 12C and the reception filter 22C. The duplexer 32D includes the transmission filter 12D and the reception filter 22D. The duplexer 32E includes the transmission filter 12E and the reception filter 22E.

Each of the five transmission filters 12A to 12E and the five reception filters 22A to 22E is, for example, a ladder filter and includes a plurality of (for example, four) series arm resonators and a plurality of (for example, three) parallel arm resonators. Each of the five transmission filters 12A to 12E and the five reception filters 22A to 22E is, for example, an acoustic wave filter, each of the plurality of series arm resonators and the plurality of parallel arm resonators being configured by an acoustic wave resonator. The acoustic wave filter is, for example, a surface acoustic wave filter using a surface acoustic wave.

In the surface acoustic wave filter, each of the plurality of series arm resonators and the plurality of parallel arm resonators is, for example, a surface acoustic wave (SAW) resonator.

Each of the five duplexers 32A to 32E includes, for example, a substrate, a first circuit portion as a transmission filter formed on the substrate, and a second circuit portion as a reception filter formed on the substrate. The substrate is, for example, a piezoelectric substrate. The piezoelectric substrate is, for example, a lithium tantalate substrate, a lithium niobate substrate, or the like. The first circuit portion and the second circuit portion include a plurality of interdigital transducer (IDT) electrodes corresponding to the plurality of series arm resonators on a one-to-one basis and a plurality of IDT electrodes corresponding to the plurality of parallel arm resonators on a one-to-one basis.

The five duplexers 32A to 32E are mounted on the first main surface 91 of the mounting substrate 9. Thus, the five duplexers 32A to 32E are arranged on the mounting substrate 9. In a plan view from the thickness direction D1 of the mounting substrate 9, the outer peripheral shape of each of the five duplexers 32A to 32E is a quadrangular shape.

Each of the five duplexers 32A to 32E may further include, for example, a spacer layer and a cover member. The spacer layer and the cover member are provided on the substrate. The spacer layer surrounds the plurality of IDT electrodes in a plan view from the thickness direction D1 of the mounting substrate 9. The spacer layer has a frame shape (rectangular frame shape) in a plan view from the thickness direction D1 of the mounting substrate 9. The spacer layer has electrical insulation properties. The material of the spacer layer is, for example, a synthetic resin such as an epoxy resin or polyimide. The cover member has a flat plate shape. In a plan view from the thickness direction D1 of the mounting substrate 9, the cover member has a rectangular shape, but may have a square shape, for example. In each of the five duplexers 32A to 32E, the outer size of the cover member, the outer size of the spacer layer, and the outer size of the cover member are substantially the same in a plan view from the thickness direction D1 of the mounting substrate 9. The cover member is arranged on the spacer layer so as to face the substrate in the thickness direction D1 of the mounting substrate 9. The cover member overlaps the plurality of IDT electrodes in the thickness direction D1 of the mounting substrate 9 and is separated from the plurality of IDT electrodes in the thickness direction D1 of the mounting substrate 9. The cover member has electrical insulation properties. The material of the cover member is, for example, a synthetic resin such as an epoxy resin or polyimide. A plurality of terminals of each of the five duplexers 32A to 32E is exposed from the cover member.

The circuit element 131 in the output matching circuit 13 is, for example, an inductor. The circuit element 131 in the output matching circuit 13 is mounted on, for example, the first main surface 91 of the mounting substrate 9, but is not limited thereto. In a plan view from the thickness direction D1 of the mounting substrate 9, the outer peripheral shape of the circuit element 131 is a quadrangular shape.

The inductor in the input matching circuit is, for example, a chip inductor. The inductor in the input matching circuit is mounted on, for example, the first main surface 91 of the mounting substrate 9, but is not limited thereto. In a plan view from the thickness direction D1 of the mounting substrate 9, the outer peripheral shape of the inductor is a quadrangular shape.

The inductor in each of the five matching circuits is, for example, a chip inductor. The inductor in each of the five matching circuits is mounted on, for example, the first main surface 91 of the mounting substrate 9, but is not limited to this. In a plan view from the thickness direction D1 of the mounting substrate 9, the outer peripheral shape of the inductor is a quadrangular shape.

The low pass filter 3 is mounted on the first main surface 91 of the mounting substrate 9. Therefore, the low pass filter 3 is arranged on the first main surface 91 of the mounting substrate 9. The low pass filter 3 includes, for example, a plurality of inductors and capacitors. The low pass filter 3 may be an integrated passive device (IPD) including a plurality of inductors and capacitors.

The high-frequency module 1 further includes a plurality of heat dissipation terminals 86 in addition to the plurality of external connection terminals 80. The plurality of external connection terminals 80 and the plurality of heat dissipation terminals 86 are arranged on the second main surface 92 of the mounting substrate 9. The material of the plurality of external connection terminals 80 and the plurality of heat dissipation terminals 86 is, for example, metal (for example, copper, a copper alloy, and the like). Each of the plurality of external connection terminals 80 and the plurality of heat dissipation terminals 86 is a columnar electrode. Here, the columnar electrode is, for example, a columnar electrode. The external connection terminal 80 and the heat dissipation terminal 86 have the same shape, but may have different shapes. In FIGS. 1 and 2, each of the heat dissipation terminals 86 is hatched with dots, but this hatching does not represent a cross section, and the hatching is merely provided to facilitate understanding of a relative positional relationship between each of the heat dissipation terminals 86 and each of the external connection terminals 80.

As described above, the plurality of external connection terminals 80 includes the antenna terminal 81, the signal input terminal 82, the signal output terminal 83, the plurality of control terminals 84, and the plurality of ground terminals 85. As described above, the plurality of ground terminals 85 is electrically connected to the ground layer of the mounting substrate 9. The ground layer is a circuit ground of the high-frequency module 1, and the plurality of circuit elements of the high-frequency module 1 includes circuit elements electrically connected to the ground layer. In addition, the plurality of external connection terminals 80 includes, for example, the first power supply terminal Vcc1 and the second power supply terminal Vcc2.

The high-frequency module 1 further includes a first resin layer 101 (see FIG. 3) that covers a plurality of circuit elements (the output stage amplifier 112, the five duplexers 32A to 32E, the circuit element 131 of the output matching circuit 13, and the like) mounted on the first main surface 91 of the mounting substrate 9 on the first main surface 91 side of the mounting substrate 9. The first resin layer 101 contains resin. The first resin layer 101 may contain a filler in addition to the resin. In FIG. 1, illustration of the first resin layer 101 is omitted.

In addition, the high-frequency module 1 further includes a second resin layer 102 (see FIG. 3) covering the plurality of circuit elements mounted on the second main surface 92 of the mounting substrate 9 (the IC chip 10, the IC chip 20, the first switch 4, and the like), and a part of each of the plurality of external connection terminals 80 and the plurality of heat dissipation terminals 86 on the second main surface 92 side of the mounting substrate 9. The second resin layer 102 is formed so as to expose the surface of the substrate of each of the IC chip 10, the IC chip 20, and the first switch 4 on the side opposite to the mounting substrate 9 side. Further, the second resin layer 102 is formed so as to expose a distal end surface of each of the plurality of external connection terminals 80 and the plurality of heat dissipation terminals 86. The second resin layer 102 contains resin. The second resin layer 102 may contain a filler in addition to the resin. The material of the second resin layer 102 may be the same as or different from the material of the first resin layer 101. In FIG. 2, illustration of the second resin layer 102 is omitted.

In addition, the high-frequency module 1 further includes a shield layer. In FIGS. 1 to 3, illustration of the shield layer is omitted. The material of the shield layer is, for example, metal. The shield layer covers a main surface 1011 and an outer peripheral surface 1013 of the first resin layer 101, an outer peripheral surface 93 of the mounting substrate 9, and an outer peripheral surface 1023 of the second resin layer 102. The shield layer is in contact with a ground layer of the mounting substrate 9. Thus, the potential of the shield layer can be made equal to the potential of the ground layer.

(1.3) Layout of Circuit Elements in High-Frequency Module

Hereinafter, a direction orthogonal to the thickness direction D1 (first direction D1) of the mounting substrate 9 and extending along the long side of the mounting substrate 9 is referred to as a second direction D2, and a direction orthogonal to both the thickness direction D1 and the second direction D2 is referred to as a third direction D3.

In the high-frequency module 1, as described above, the inter-stage matching circuit 113, the output stage amplifier 112, the output matching circuit 13, the five duplexers 32A to 32E, and the low pass filter 3 are arranged on the first main surface 91 of the mounting substrate 9. In addition, in the high-frequency module 1, the first switch 4, the IC chip 10, and the IC chip 20 are arranged on the second main surface 92 of the mounting substrate 9. In addition, in the high-frequency module 1, the plurality of external connection terminals 80 and the plurality of heat dissipation terminals 86 are arranged on the second main surface 92 of the mounting substrate 9.

In the high-frequency module 1, the plurality of external connection terminals 80 includes a first group of external connection terminals 80 arranged along the outer periphery of the second main surface 92 of the mounting substrate 9, and a second group of external connection terminals 80 arranged inside the first group of external connection terminals 80 on the second main surface 92 of the mounting substrate 9. The first group of external connection terminals 80 includes the ground terminal 85, the antenna terminal 81, the signal input terminal 82, the signal output terminal 83, the control terminal 84, the first power supply terminal Vcc1, and the second power supply terminal Vcc2. The antenna terminal 81 is arranged near one of four corner portions of the second main surface 92 of the mounting substrate 9. The second group of external connection terminals 80 includes the ground terminal 85 and the control terminal 84. The plurality of heat dissipation terminals 86 overlaps the output stage amplifier 112 in a plan view from the thickness direction D1 of the mounting substrate 9. The plurality of heat dissipation terminals 86 is arranged in a two-dimensional array in a plan view from the thickness direction D1 of the mounting substrate 9. The mounting substrate 9 further includes a plurality of through-electrodes 94 (see FIG. 3). The plurality of through-electrodes 94 connects the output stage amplifier 112 and the plurality of heat dissipation terminals 86. The plurality of through-electrodes 94 is formed over the entire length of the thickness direction D1 of the mounting substrate 9. The through-electrode 94 penetrates the plurality of dielectric layers of the mounting substrate 9 in the thickness direction D1 of the mounting substrate 9.

The first switch 4 connected to the antenna terminal 81 is located near the antenna terminal 81. The first switch 4 is adjacent to the antenna terminal 81 near a first corner portion 95 among the first corner portion 95, a second corner portion 96, a third corner portion 97, and a fourth corner portion 98 in a plan view from the thickness direction D1 of the mounting substrate 9. The first corner portion 95 and the second corner portion 96 are separated from each other in the second direction D2, the first corner portion 95 and the third corner portion 97 are separated from each other in a direction of one diagonal line, and the first corner portion 95 and the fourth corner portion 98 are separated from each other in the third direction D3.

The IC chip 20 is located near the first switch 4 on the second main surface 92 of the mounting substrate 9. The IC chip 20 is separated from the first switch 4 in the third direction D3. In the IC chip 20, the third switch 6 and the low noise amplifier 21 are arranged side by side in the second direction D2.

The IC chip 10 is located away from the first switch 4 and the IC chip 20 in the second direction D2. In the IC chip 10, the driver stage amplifier 111, the controller 14, and the second switch 5 are arranged in this order in the third direction D3. In the IC chip 10, the driver stage amplifier 111 is located near the third corner portion 97, and the second switch 5 is located near the second corner portion 96, in a plan view from the thickness direction D1 of the mounting substrate 9. Thus, the driver stage amplifier 111 and the first switch 4 are separated from each other in the direction along the one diagonal line described above.

The second group of external connection terminals 80 is located between the IC chip 10 and the IC chip 20 and the first switch 4 in the second direction D2. The second group of external connection terminals 80 is aligned in the third direction D3.

The low pass filter 3 mounted on the first main surface 91 of the mounting substrate 9 is located near the fourth corner portion 98 in a plan view from the thickness direction D1 of the mounting substrate 9. The low pass filter 3 overlaps the first switch 4 in a plan view from the thickness direction D1 of the mounting substrate 9.

The circuit element 114 included in the inter-stage matching circuit 113 is located near the third corner portion 97 in a plan view from the thickness direction D1 of the mounting substrate 9. At least a part of the circuit element 114 overlaps the driver stage amplifier 111 when viewed from the thickness direction D1 of the mounting substrate 9.

The output stage amplifier 112 is located near the third corner portion 97 in a plan view from the thickness direction D1 of the mounting substrate 9. The output stage amplifier 112 is adjacent to the inter-stage matching circuit 113 in the second direction D2.

The output matching circuit 13 is located near the second corner portion 96 in a plan view from the thickness direction D1 of the mounting substrate 9. The output matching circuit 13 is adjacent to the output stage amplifier 112 and the inter-stage matching circuit 113 in the third direction D3.

The five duplexers 32A to 32E are located between the low pass filter 3 and the output stage amplifier 112 and the output matching circuit 13 in a plan view from the thickness direction D1 of the mounting substrate 9.

(2) Method of Manufacturing High-Frequency Module

In the method of manufacturing the high-frequency module 1, for example, a first step of mounting a plurality of circuit elements on the mounting substrate 9 is performed. Further, in the first step, a step of arranging a plurality of conductor pillars from which the plurality of external connection terminals 80 and the plurality of heat dissipation terminals 86 are formed on the second main surface 92 of the mounting substrate 9 is performed.

After the first step described above, a second step is performed. In the second step, a step of forming the first resin layer 101 covering the plurality of circuit elements on the first main surface 91 side of the mounting substrate 9 and a step of forming a resin layer serving as a base of the second resin layer 102 covering the plurality of circuit elements and the plurality of conductor pillars on the second main surface 92 side of the mounting substrate 9 are performed.

After the second step described above, a third step is performed. In the third step, the resin layer or the like formed in the second step is ground from the surface opposite to the mounting substrate 9 side. Here, in the third step, the second resin layer 102 is formed by grinding the resin layer. Further, in the third step, after the surface of the substrate of at least one circuit element of the plurality of circuit elements on the side opposite to the mounting substrate 9 side is exposed by grinding the resin layer, grinding is further performed to thin the substrate of each of the plurality of circuit elements. In the third step, the plurality of external connection terminals 80 is formed by grinding the plurality of conductor pillars.

After the third step described above, a fourth step is performed. In the fourth step, a shield layer is formed. Note that the first step, the second step, and the third step may be performed on a multi-piece substrate including a plurality of mounting substrates 9 and capable of obtaining multiple pieces of the mounting substrates 9. In this case, for example, the fourth step may be performed after the multi-piece substrate is separated into the individual mounting substrates 9 after the third step.

(3) Summary (3.1) High-Frequency Module

The high-frequency module 1 according to Embodiment 1 includes the mounting substrate 9, the power amplifier 11, and an electronic component 2. The mounting substrate 9 has the first main surface 91 and the second main surface 92 that face each other. The power amplifier 11 is arranged on the mounting substrate 9. The electronic component 2 is arranged on the mounting substrate 9. The power amplifier 11 includes the driver stage amplifier 111 and the output stage amplifier 112. The driver stage amplifier 111 is arranged on the second main surface 92 of the mounting substrate 9. The output stage amplifier 112 is arranged on the first main surface 91 of the mounting substrate 9. The electronic component 2 is arranged on the first main surface 91 of the mounting substrate 9. The electronic component 2 at least partially overlaps the driver stage amplifier 111 in a plan view from the thickness direction D1 of the mounting substrate 9.

The high-frequency module 1 according to Embodiment 1 can be reduced in size. In short, the high-frequency module 1 according to Embodiment 1 can reduce the size of the mounting substrate 9 in a plan view from the thickness direction D1 of the mounting substrate 9.

In addition, in the high-frequency module 1 according to Embodiment 1, the output stage amplifier 112 and the driver stage amplifier 111 do not overlap each other in a plan view from the thickness direction D1 of the mounting substrate 9. Thus, in the high-frequency module 1 according to Embodiment 1, the driver stage amplifier 111 is less likely to be affected by heat from the output stage amplifier 112. Therefore, the high-frequency module 1 according to Embodiment 1 can suppress deterioration in characteristics of the driver stage amplifier 111.

Further, the high-frequency module 1 according to Embodiment 1 further includes the heat dissipation terminal 86. The heat dissipation terminal 86 is arranged on the second main surface 92 of the mounting substrate 9. The heat dissipation terminal 86 overlaps the output stage amplifier 112 in a plan view from the thickness direction D1 of the mounting substrate 9. The mounting substrate 9 further includes the through-electrode 94. The through-electrode 94 connects the output stage amplifier 112 and the heat dissipation terminal 86. Thus, the high-frequency module 1 according to Embodiment 1 easily radiates heat generated in the output stage amplifier 112.

As the high-frequency module of a comparative example, a high-frequency module in which a plurality of components is separately mounted on a first main surface and a second main surface of a mounting substrate in order to reduce the size of the high-frequency module disclosed in Patent Document 1 can be considered. However, in the high-frequency module of the comparative example, when an IC chip (power amplifier) including a driver stage amplifier and an output stage amplifier may overlap the component in a thickness direction of the mounting substrate, there is a concern that characteristics are deteriorated. More specifically, in the high-frequency module of the comparative example, for example, there is a concern that the characteristics of circuit components overlapping the power amplifier in the thickness direction of the mounting substrate may be degraded due to the influence of heat from the power amplifier, or there is a concern that heat generated in the power amplifier may be difficult to be radiated and the characteristics of the power amplifier may be degraded. In contrast, the high-frequency module 1 according to Embodiment 1 has no circuit component that is arranged on the second main surface 92 of the mounting substrate 9 and overlaps the output stage amplifier 112 in a plan view from the thickness direction D1 of the mounting substrate 9. As a result, the high-frequency module 1 according to Embodiment 1 can be reduced in size while suppressing degradation of the characteristics of the output stage amplifier 112 arranged on the first main surface 91 of the mounting substrate 9 and the circuit components (the IC chip 10, the IC chip 20, and the first switch 4 in the high-frequency module 1 of Embodiment 1) arranged on the second main surface 92 of the mounting substrate 9.

In addition, in the high-frequency module 1 according to Embodiment 1, the electronic component 2 is the circuit element 114. The circuit element 114 is included in the inter-stage matching circuit 113. The inter-stage matching circuit 113 is connected between the driver stage amplifier 111 and the output stage amplifier 112. In the high-frequency module 1 according to Embodiment 1, since the electronic component 2 is the circuit element 114 included in the inter-stage matching circuit 113, a wiring length between the driver stage amplifier 111 and the inter-stage matching circuit 113 can be shortened.

In addition, in the high-frequency module 1 according to Embodiment 1, the inter-stage matching circuit 113 can be configured by a chip inductor or a conductor portion of the mounting substrate 9 that is separate from the driver stage amplifier 111 and the output stage amplifier 112. Thus, in the high-frequency module 1 according to Embodiment 1, the performance of the inter-stage matching circuit 113 can be improved and the performance of the power amplifier 11 can be improved as compared with a case where a single-chip power amplifier including a driver stage amplifier, an output stage amplifier, and an inter-stage matching circuit is provided. The performance of the power amplifier 11 includes efficiency and gain. In the high-frequency module 1 according to Embodiment 1, isolation in the power amplifier 11 can be improved, hopping of a transmission signal in the power amplifier 11 can be suppressed, and the operation of the power amplifier 11 can be stabilized as compared with a case where a single-chip power amplifier including a driver stage amplifier, an output stage amplifier, and an inter-stage matching circuit is provided.

(3.2) Communication Device

A communication device 300 according to Embodiment 1 includes the high-frequency module 1 and the signal processing circuit 301. The signal processing circuit 301 performs signal processing on the transmission signal. The high-frequency module 1 amplifies and outputs a transmission signal from the signal processing circuit 301. The high-frequency module 1 transmits a transmission signal between the antenna 310 and the signal processing circuit 301.

Since the communication device 300 according to Embodiment 1 includes the high-frequency module 1, miniaturization can be achieved. The plurality of electronic components configuring the signal processing circuit 301 may be mounted on, for example, the above-described circuit board, or may be mounted on a circuit board (second circuit board) different from the circuit board (first circuit board) on which the high-frequency module 1 is mounted.

(4) Modification of High-Frequency Module

Figure 5:
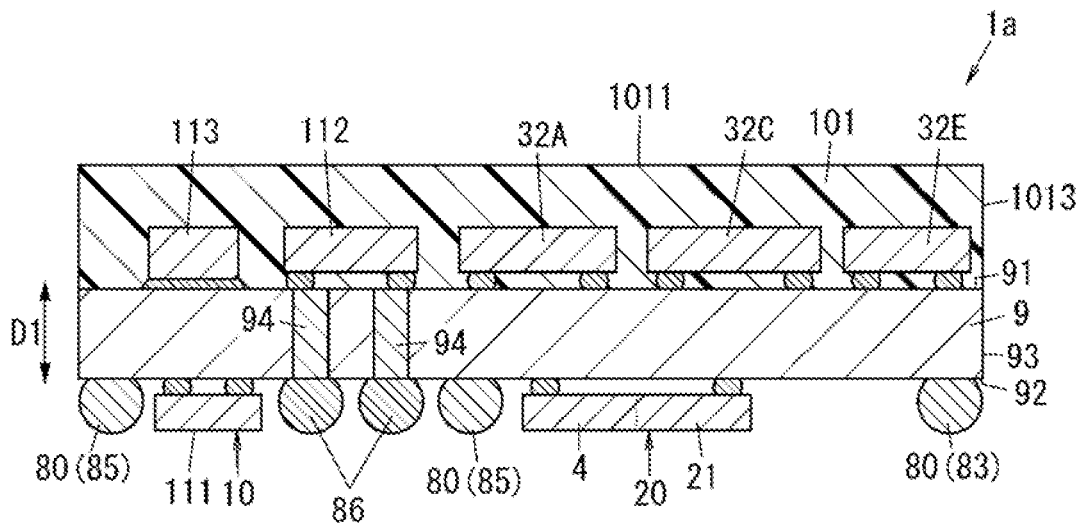
FIG. 5 is a cross-sectional view of a high-frequency module according to a modification of Embodiment 1.

A high-frequency module 1a according to a modification of Embodiment 1 will be described with reference to FIG. 5. Regarding the high-frequency module 1a according to the modification, the same components as those of the high-frequency module 1 according to Embodiment 1 are denoted by the same reference numerals, and description thereof will be omitted.

The high-frequency module 1a according to the modification differs from the high-frequency module 1 according to Embodiment 1 in that the plurality of external connection terminals 80 and the plurality of heat dissipation terminals 86 are ball bumps. In addition, the high-frequency module 1a according to the modification differs from the high-frequency module 1 according to Embodiment 1 in that the high-frequency module 1a does not include the second resin layer 102 of the high-frequency module 1 according to Embodiment 1. The high-frequency module 1a according to the modification may include an underfill portion provided in a space between each of the IC chip 10, the IC chip 20, and the first switch 4 and the second main surface 92 of the mounting substrate 9.

The material of the ball bumps forming each of the plurality of external connection terminals 80 and the plurality of heat dissipation terminals 86 is, for example, gold, copper, solder, or the like.

The plurality of external connection terminals 80 may be a mixture of external connection terminals 80 formed by ball bumps and external connection terminals 80 formed by columnar electrodes. Further, the plurality of heat dissipation terminals 86 may be a mixture of heat dissipation terminals 86 formed by ball bumps and heat dissipation terminals 86 formed by columnar electrodes.

Embodiment 2

Figure 6:
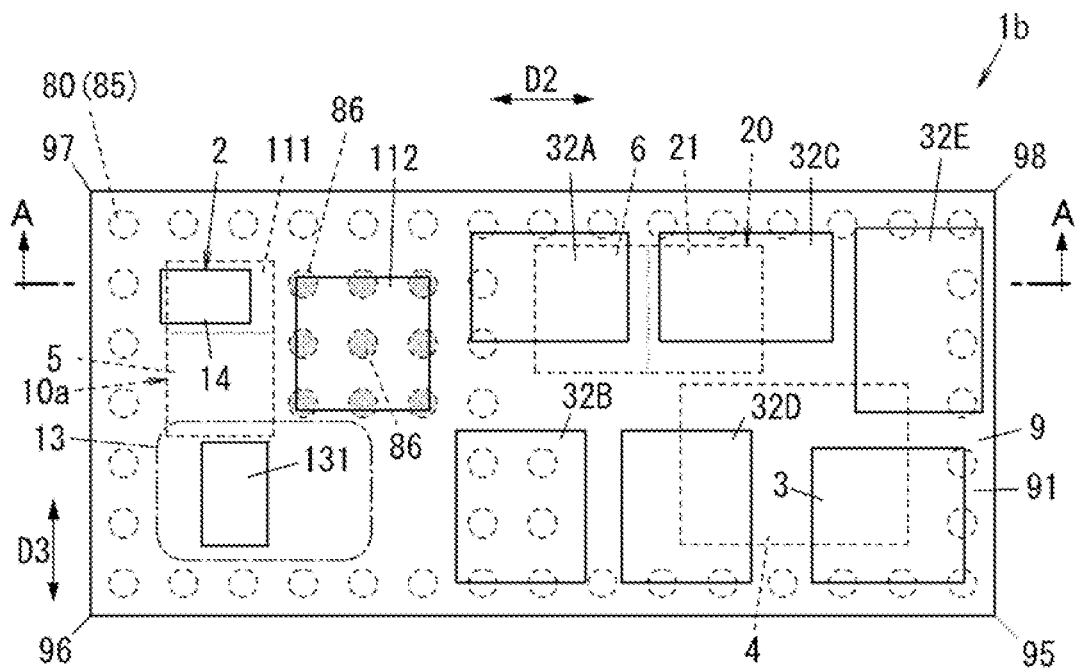
FIG. 6 is a plan view of a high-frequency module according to Embodiment 2.
Figure 7:
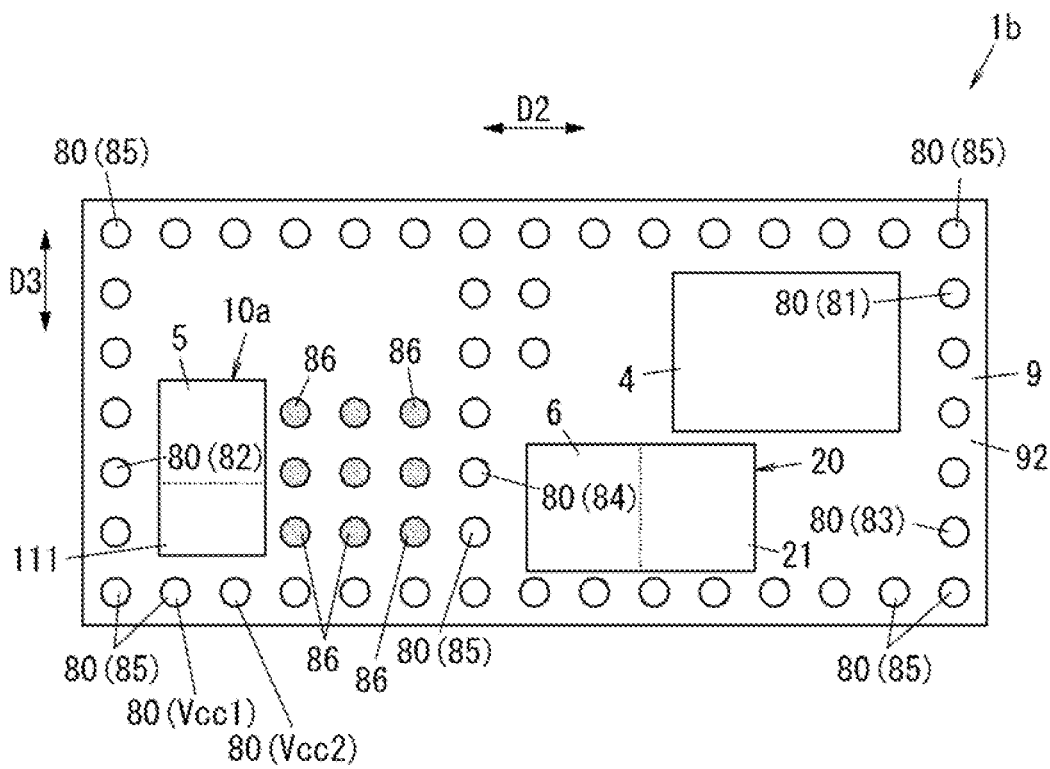
FIG. 7 is a bottom view of the above high-frequency module.
Figure 8:
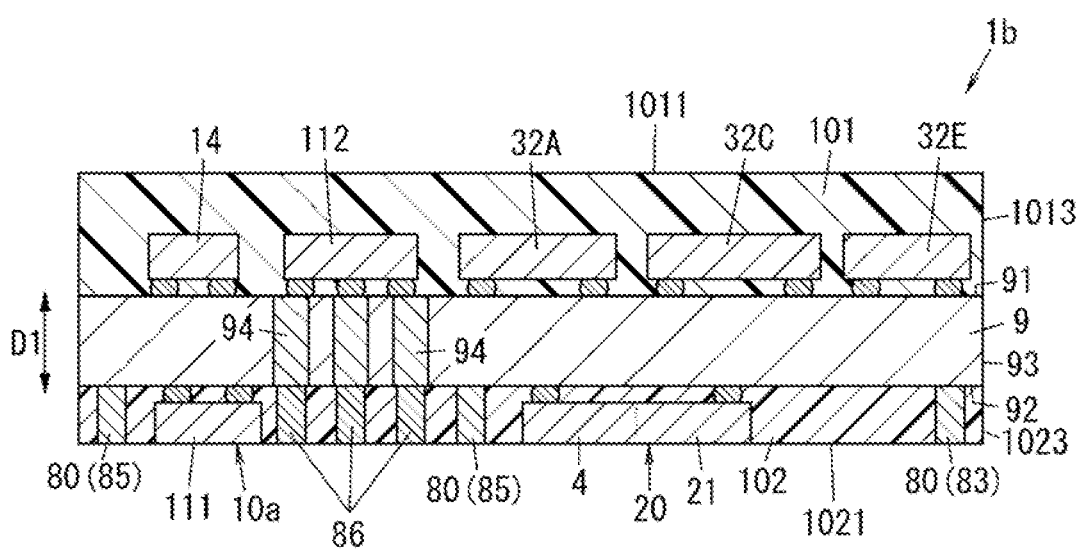
FIG. 8 is a cross-sectional view illustrating the above high-frequency module taken along a line A-A of FIG. 6.

A high-frequency module 1b according to Embodiment 2 will be described with reference to FIGS. 6 to 8. Regarding the high-frequency module 1b according to Embodiment 2, the same components as those of the high-frequency module 1 according to Embodiment 1 are denoted by the same reference numerals, and description thereof will be omitted.

The high-frequency module 1b according to Embodiment 2 differs from the high-frequency module 1 according to Embodiment 1 in that the controller 14 is a single-chip IC chip and is mounted on the first main surface 91 of the mounting substrate 9. In the high-frequency module 1b according to Embodiment 2, the electronic component 2 arranged on the first main surface 91 of the mounting substrate 9 and at least partially overlapping the driver stage amplifier 111 in a plan view from the thickness direction D1 of the mounting substrate 9 includes the controller 14. In addition, the high-frequency module 1b according to Embodiment 2 differs from the high-frequency module 1 according to Embodiment 1 in that the high-frequency module 1b includes an IC chip 10a instead of the IC chip 10 of the high-frequency module 1 according to Embodiment 1. The IC chip 10a is a single-chip IC chip including the driver stage amplifier 111 and the second switch 5, and is mounted on the second main surface 92 of the mounting substrate 9 in the same manner as the IC chip 10.

As with the high-frequency module 1 according to Embodiment 1, the high-frequency module 1b according to Embodiment 2 includes the electronic component 2 that is arranged on the first main surface 91 of the mounting substrate 9 and at least partially overlaps the driver stage amplifier 111 in a plan view from the thickness direction D1 of the mounting substrate 9, so that miniaturization can be achieved.

In the high-frequency module 1b according to Embodiment 2, the electronic component 2 includes the controller 14 that controls the power amplifier 11. Thus, in the high-frequency module 1b according to Embodiment 2, a wiring length between the output stage amplifier 112 and the controller 14 can be shortened.

Embodiment 3

Figure 9:
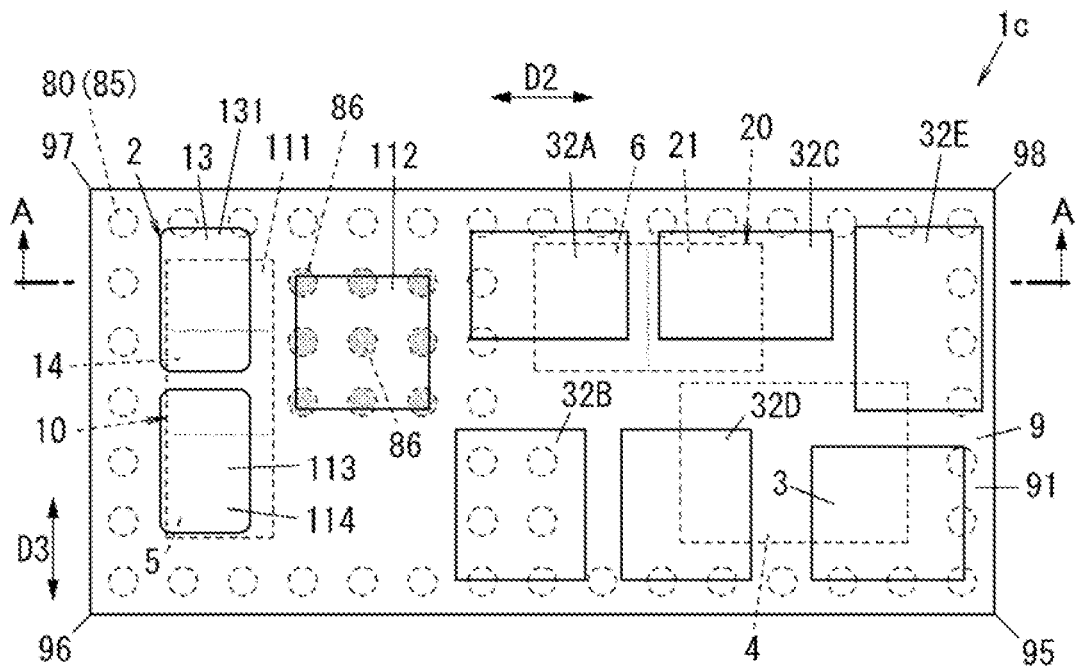
FIG. 9 is a plan view of a high-frequency module according to Embodiment 3.
Figure 10:
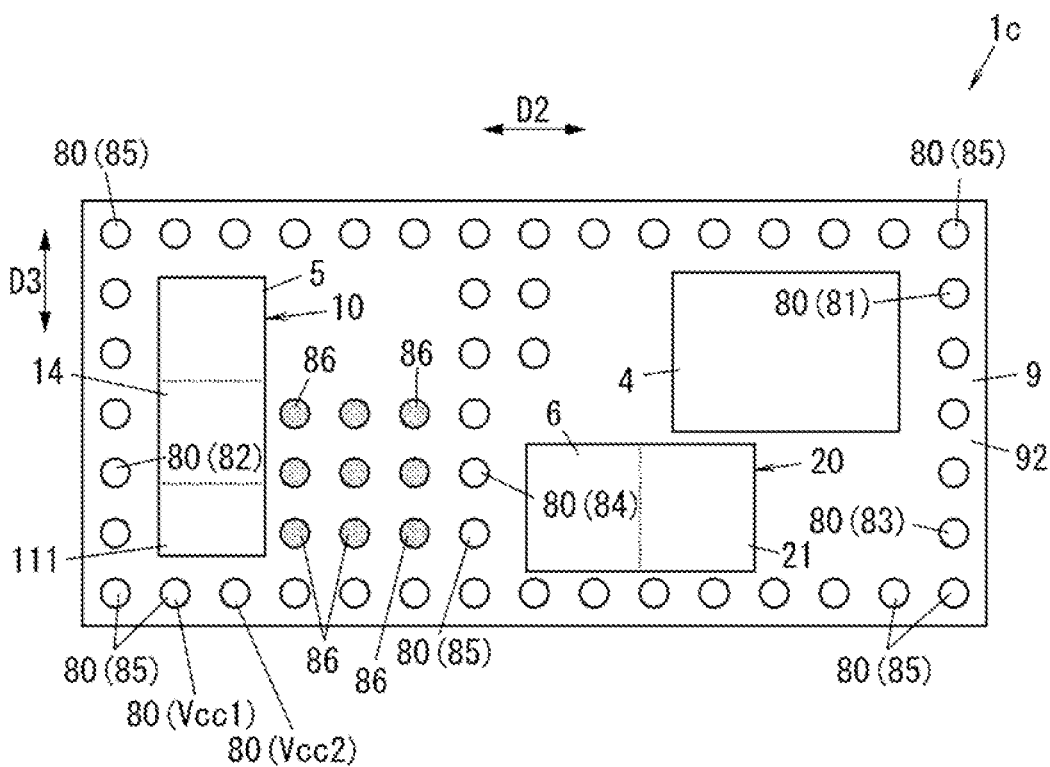
FIG. 10 is a bottom view of the above high-frequency module.
Figure 11:
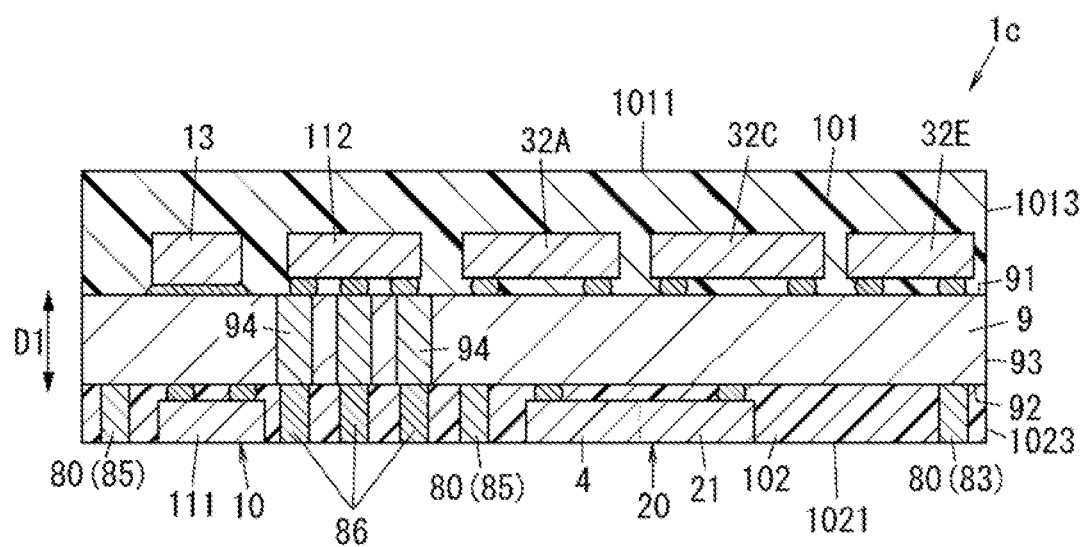
FIG. 11 is a cross-sectional view illustrating the above high-frequency module taken along a line A-A of FIG. 9.

A high-frequency module 1c according to Embodiment 3 will be described with reference to FIGS. 9 to 11. Regarding the high-frequency module 1c according to Embodiment 3, the same components as those of the high-frequency module 1 according to Embodiment 1 are denoted by the same reference numerals, and description thereof will be omitted.

The high-frequency module 1c according to Embodiment 3 differs from the high-frequency module 1 according to Embodiment 1 in that the output matching circuit 13 overlaps the driver stage amplifier 111 in a plan view from the thickness direction D1 of the mounting substrate 9. In the high-frequency module 1c according to Embodiment 3, the position of the output matching circuit 13 and the position of the inter-stage matching circuit 113 are reversed.

In the high-frequency module 1c according to Embodiment 3, the electronic component 2 arranged on the first main surface 91 of the mounting substrate 9 and at least partially overlapping the driver stage amplifier 111 in a plan view from the thickness direction D1 of the mounting substrate 9 includes the circuit element 131 of the output matching circuit 13.

As with the high-frequency module 1 according to Embodiment 1, the high-frequency module 1c according to Embodiment 3 includes the electronic component 2 that is arranged on the first main surface 91 of the mounting substrate 9 and at least partially overlaps the driver stage amplifier 111 in a plan view from the thickness direction D1 of the mounting substrate 9, so that miniaturization can be achieved.

In the high-frequency module 1c according to Embodiment 3, the electronic component 2 includes the circuit element 131 of the output matching circuit 13. Thus, in the high-frequency module 1c according to Embodiment 3, the wiring length between the output stage amplifier 112 and the output matching circuit 13 can be shortened.

(Other Modifications)

The above-described Embodiments 1 to 3 are merely one of various embodiments of the present disclosure. The above-described embodiment can be modified in various ways according to the design and the like as long as the object of the present disclosure can be achieved.

For example, the mounting substrate 9 may be a component-embedded substrate.

In addition, in the high-frequency modules 1, 1a, 1b, and 1c, the output stage amplifier 112 is mounted on the first main surface 91 of the mounting substrate 9, and the driver stage amplifier 111 is mounted on the second main surface 92 of the mounting substrate 9, but is not limited thereto. For example, the output stage amplifier 112 may be mounted on the second main surface 92 of the mounting substrate 9 and the driver stage amplifier 111 may be mounted on the first main surface 91 of the mounting substrate 9.

In addition, the output stage amplifier 112 may be mounted on the first main surface 91 of the mounting substrate 9 in a mounting form using a bonding wire instead of being flip-chip mounted on the first main surface 91 of the mounting substrate 9. That is, the output stage amplifier 112 may be arranged on (mechanically connected to) the first main surface 91 of the mounting substrate 9 by being bonded to the first main surface 91 of the mounting substrate 9 with a die bonding material, and a terminal (pad electrode) may be electrically connected to a conductor portion of the conductor pattern layer on the first main surface 91 side of the mounting substrate 9 via a bonding wire.

In addition, in the high-frequency modules 1, 1b, and 1c, the second resin layer 102 may cover the surface of each of the IC chip 10, the IC chip 20, and the first switch 4 on the side opposite to the mounting substrate 9 side.

The number of selection terminals in each of the first switch 4, the second switch 5, and the third switch 6 may be plural and is not limited to the illustrated number.

In addition, in the high-frequency modules 1, 1a, 1b, and 1c, the first switch 4 and the IC chip 20 are different IC chips from each other, but are not limited thereto, and the first switch 4, the third switch 6, and the low noise amplifier 21 may be integrated into one chip.

Each of the first switch 4 and the second switch 5 may be controlled by a control signal from the RF signal processing circuit 302 of the signal processing circuit 301, for example, instead of being controlled by the controller 14.

In addition, the substrate of the output stage amplifier 112 is not limited to a gallium arsenide substrate, and may be, for example, a silicon substrate. In this case, the transistor included in the output stage amplifier 112 is not an HBT but a bipolar transistor.

In addition, the substrate of the driver stage amplifier 111 is not limited to a silicon substrate, and may be, for example, a gallium arsenide substrate.

Further, the high-frequency modules 1, 1a, 1b, and 1c may include the plurality of transmission filters 12A to 12E and the plurality of reception filters 22A to 22E instead of the plurality of duplexers 32A to 32E. Further, at least one of the plurality of duplexers 32A to 32D may be a filter used for communication corresponding to time division duplex (TDD). In addition, the high-frequency modules 1, 1a, 1b, and 1c may have only the signal path Tx' for transmission signals among the signal path Tx' for transmission signals and the signal path Rx1 for reception signals. In this case, the high-frequency modules 1, 1a, 1b, and 1c only need to include, for example, the plurality of transmission filters 12A to 12E, instead of the plurality of duplexers 32A to 32E.

In addition, the above-described filter is an acoustic wave filter using a surface acoustic wave, but is not limited thereto, and may be, for example, an acoustic wave filter using a boundary acoustic wave, a plate wave, or the like.

In the acoustic wave filter, each of the plurality of series arm resonators and the plurality of parallel arm resonators is not limited to a SAW resonator, and may be, for example, a bulk acoustic wave (BAW) resonator.

Alternatively, the filter may be an LC filter. In a case where the filter is formed by an acoustic wave filter, it is possible to improve attenuation characteristics in the vicinity of the pass band as compared with a case where the filter is formed by an LC filter. Further, in the case where the filter is formed by an acoustic wave filter, F (reflection coefficient) in the midband can be increased as compared with the case where the filter is formed of an LC filter.

The output matching circuit 13 may be, for example, a single-chip IC chip including a substrate and an IC unit including a plurality of inductors and a plurality of capacitors formed on the substrate. In this case, the IC chip may be an IPD. The substrate is, for example, a silicon substrate. In the case of the IPD, the output matching circuit 13 is flip-chip mounted on the first main surface 91 of the mounting substrate 9, for example.

In the high-frequency modules 1, 1b, and 1c, a distal end portion of each of the plurality of external connection terminals 80 and the plurality of heat dissipation terminals 86 may include, for example, a gold plating layer.

Figure 4:
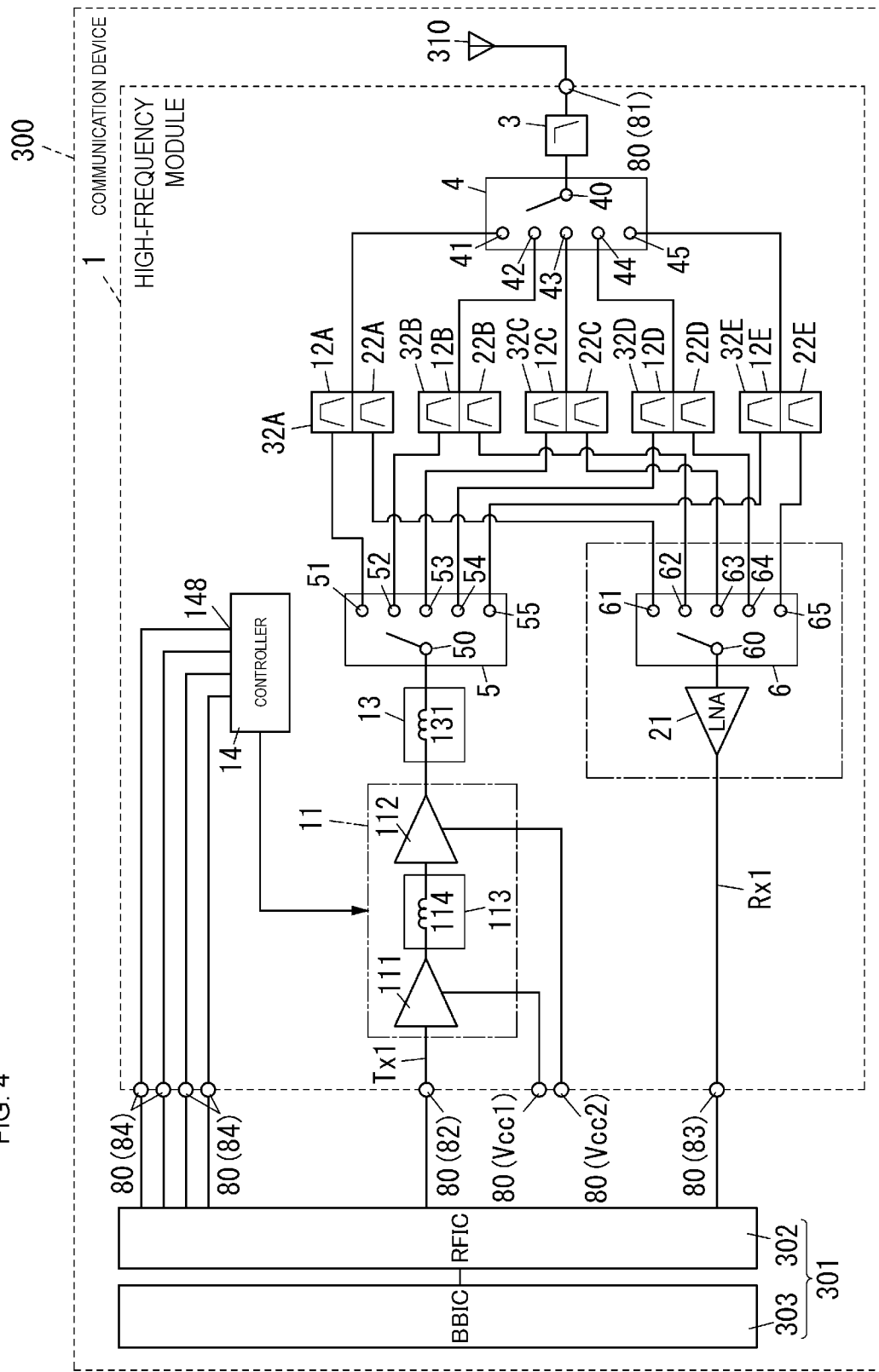
FIG. 4 is a circuit configuration diagram of a communication device including the above high-frequency module.

The circuit configurations of the high-frequency modules 1, 1a, 1b, and 1c are not limited to the example illustrated in FIG. 4. In addition, each of the high-frequency modules 1 to 1c may include, for example, a high-frequency front-end circuit corresponding to MIMO (Multi Input Multi Output) as a circuit configuration.

The high-frequency modules 1, 1a, 1b, and 1c may include a multiplexer (diplexer, triplexer, or the like) instead of the low pass filter 3. The multiplexer includes, for example, at least two of a low pass filter, a band pass filter, and a high pass filter.

In addition, the communication device 300 according to Embodiment 1 may include any one of the high-frequency modules 1*a*, 1*b*, and 1*c* instead of the high-frequency module 1.

(Aspects)

The following aspects are disclosed in this specification. Element numbers used in the description below are intended to be illustrative only and not exhaustive. Moreover, the use of these element numbers is not intended to impart any limitation to the scope of the appended claims.

A high-frequency module (1; 1*a*; 1*b*; 1*c*) according to a first aspect includes a mounting substrate (9), a power amplifier (11), and an electronic component (2). The mounting substrate (9) has a first main surface (91) and a second main surface (92) facing each other. The power amplifier (11) is arranged on the mounting substrate (9). The electronic component (2) is arranged on the mounting substrate (9). The power amplifier (11) has a driver stage amplifier (111) and an output stage amplifier (112). The driver stage amplifier (111) is arranged on the second main surface (92) of the mounting substrate (9). The output stage amplifier (112) is arranged on the first main surface (91) of the mounting substrate (9). The electronic component (2) is arranged on the first main surface (91) of the mounting substrate (9). The electronic component (2) at least partially overlaps the driver stage amplifier (111) in a plan view from a thickness direction (D1) of the mounting substrate (9).

In the high-frequency module (1; 1*a*; 1*b*; 1*c*) according to the first aspect, miniaturization can be achieved.

In the high-frequency module (1; 1*a*; 1*b*; 1*c*) according to a second aspect, in the first aspect, the output stage amplifier (112) and the driver stage amplifier (111) do not overlap each other in a plan view from the thickness direction (D1) of the mounting substrate (9).

In the high-frequency module (1; 1*a*; 1*b*; 1*c*) according to the second aspect, the driver stage amplifier (111) is less likely to be affected by heat from the output stage amplifier (112).

The high-frequency module (1; 1*a*; 1*b*; 1*c*) according to a third aspect further includes a heat dissipation terminal (86) in the first or second aspect. The heat dissipation terminal (86) is arranged on the second main surface (92) of the mounting substrate (9). The heat dissipation terminal (86) overlaps the output stage amplifier (112) in a plan view from the thickness direction (D1) of the mounting substrate (9). The mounting substrate (9) further includes a through-electrode (94). The through-electrode (94) connects the output stage amplifier (112) and the heat dissipation terminal (86).

In the high-frequency module (1; 1*a*; 1*b*; 1*c*) according to the third aspect, heat generated in the output stage amplifier (112) is easily dissipated.

In the high-frequency module (1; 1*a*; 1*b*; 1*c*) according to a fourth aspect, in the third aspect, there is no circuit component that is arranged on the second main surface (92) of the mounting substrate (9) and overlaps the output stage amplifier (112) in a plan view from the thickness direction (D1) of the mounting substrate (9).

In the high-frequency module (1; 1*a*; 1*b*; 1*c*) according to the fourth aspect, miniaturization can be achieved while suppressing deterioration in characteristics of circuit components arranged on the second main surface (92) of the mounting substrate (9).

In the high-frequency module (1; 1*a*) according to a fifth aspect, in any one of the first to fourth aspects, the electronic component (2) is a circuit element (114). The circuit element (114) is included in an inter-stage matching circuit (113). The inter-stage matching circuit (113) is connected between the driver stage amplifier (111) and the output stage amplifier (112).

In the high-frequency module (1; 1*a*) according to the fifth aspect, a wiring length between the driver stage amplifier (111) and the inter-stage matching circuit (113) can be shortened.

In the high-frequency module (1; 1*a*) according to a sixth aspect, in the fifth aspect, the circuit element (114) is an inductor.

In the high-frequency module (1; 1*a*) according to the sixth aspect, loss in the inter-stage matching circuit (113) can be reduced.

In the high-frequency module (1*b*) according to a seventh aspect, in any one of the first to fourth aspects, the electronic component (2) is a controller (14) that controls the power amplifier (11).

In the high-frequency module (1*b*) according to the seventh aspect, a wiring length between the output stage amplifier (112) and the controller (14) can be shortened.

The high-frequency module (1*c*) according to an eighth aspect, in any one of the first to fifth aspects, further includes a plurality of transmission filters (12A to 12E) and a switch (5). The plurality of transmission filters (12A to 12E) has different pass bands from each other. The switch (5) includes a common terminal (50) and a plurality of selection terminals (51 to 55). The common terminal (50) is connected to the output stage amplifier (112). The plurality of selection terminals (51 to 55) is connected to the plurality of transmission filters (12A to 12E) on a one-to-one basis. The electronic component (2) is a circuit element (131) included in an output matching circuit (13) provided between the output stage amplifier (112) and the common terminal (50) of the switch (5) in a signal path (Tx1) for transmission signals.

In the high-frequency module (1*c*) according to the eighth aspect, a wiring length between the output matching circuit (13) and the output stage amplifier (112) can be shortened.

In a high-frequency module (1*c*) according to a ninth aspect, in the eighth aspect, the circuit element (131) is an inductor.

In the high-frequency module (1*c*) according to the ninth aspect, miniaturization can be achieved.

In the high-frequency module (1; 1*a*; 1*b*; 1*c*) according to a tenth aspect, in any one of the fifth to ninth aspects, the electronic component (2) and the output stage amplifier (112) are adjacent to each other in a plan view from the thickness direction (D1) of the mounting substrate (9).

In the high-frequency module (1; 1*a*; 1*b*; 1*c*) according to the tenth aspect, a wiring length between the electronic component (2) and the output stage amplifier (112) can be shortened.

The high-frequency module (1; 1*a*; 1*c*) according to an eleventh aspect, in any one of the first to fifth aspects, further includes the controller (14), the plurality of transmission filters (12A to 12E), and the switch (5). The controller (14) controls the power amplifier (11). The plurality of transmission filters (12A to 12E) has different pass bands from each other. The switch (5) includes the common terminal (50) and the plurality of selection terminals (51 to 55). The common terminal (50) is connected to the output stage amplifier (112). The plurality of selection terminals (51 to 55) is connected to the plurality of transmission filters (12A to 12E) on a one-to-one basis. In the high-frequency module (1; 1a; 1b; 1c), the driver stage amplifier (111), the controller (14) and the switch (5) are included in one semiconductor chip (IC chip 10).

In the high-frequency module (1; 1a; 1c) according to the eleventh aspect, further miniaturization can be achieved, and the driver stage amplifier (111) can be more stably controlled by the controller (14).

The high-frequency module (1; 1a; 1b; 1c) according to a twelfth aspect, in any one of the first to eleventh aspects, further includes an IC chip (20). The IC chip (20) is arranged on the second main surface (92) of the mounting substrate (9). The IC chip (20) includes a low noise amplifier (21). In the high-frequency module (1; 1a; 1b; 1c) according to the twelfth aspect, the output stage amplifier (112) and the IC chip (20) do not overlap each other in a plan view from the thickness direction (D1) of the mounting substrate (9).

In the high-frequency module (1; 1a; 1b; 1c) according to the twelfth aspect, isolation between the output stage amplifier (112) and the IC chip (20) including the low noise amplifier (21) can be improved.

The high-frequency module (1; 1a; 1b; 1c) according to a thirteenth aspect, in the twelfth aspect, further includes a plurality of external connection terminals (80). The plurality of external connection terminals (80) is arranged on the second main surface (92) of the mounting substrate (9). The plurality of external connection terminals (80) includes a ground terminal (85). The ground terminal (85) is located between the driver stage amplifier (111) and the IC chip (20) in a plan view from the thickness direction (D1) of the mounting substrate (9).

In the high-frequency module (1; 1a; 1b; 1c) according to the thirteenth aspect, isolation between the driver stage amplifier (111) and the IC chip (20) including the low noise amplifier (21) can be improved.

The high-frequency module (1; 1a; 1b; 1c) according to a fourteenth aspect, in the seventh or eleventh aspect, further includes the IC chip (20) and the plurality of external connection terminals (80). The IC chip (20) is arranged on the second main surface (92) of the mounting substrate (9). The IC chip (20) includes the low noise amplifier (21). The plurality of external connection terminals (80) is arranged on the second main surface (92) of the mounting substrate (9). In the high-frequency module (1; 1a; 1b; 1c), the output stage amplifier (112) and the IC chip (20) do not overlap each other in a plan view from the thickness direction (D1) of the mounting substrate (9). The plurality of external connection terminals (80) includes a control terminal (84). The control terminal (84) is located between the driver stage amplifier (111) and the IC chip (20) in a plan view from the thickness direction (D1) of the mounting substrate (9). The controller (14) controls the power amplifier (11) based on a control signal obtained from the control terminal (84).

In the high-frequency module (1; 1a; 1b; 1c) according to the fourteenth aspect, isolation between the driver stage amplifier (111) and the IC chip (20) including the low noise amplifier (21) can be improved.

In the high-frequency module (1; 1a; 1b; 1c) according to a fifteenth aspect, in any one of the first to fourteenth aspects, the power amplifier (11) performs an envelope tracking operation.

In the high-frequency module (1; 1a; 1b; 1c) according to the fifteenth aspect, the operation of the power amplifier (11) that performs the envelope tracking operation can be further stabilized.

A communication device (300) according to a sixteenth aspect includes a signal processing circuit (301) and the high-frequency module (1; 1a; 1b; 1c) according to any one of the first to fifteenth aspects. The power amplifier (11) of the high-frequency module (1; 1a; 1b; 1c) amplifies and outputs transmission signals from the signal processing circuit (301).

In the communication device (300) according to the sixteenth aspect, miniaturization can be achieved.

REFERENCE SIGNS LIST 1, 1a, 1b, 1c HIGH-FREQUENCY MODULE
2 ELECTRONIC COMPONENT
3 LOW PASS FILTER
4 SWITCH (FIRST SWITCH)
40 COMMON TERMINAL
41 to 45 SELECTION TERMINAL
5 SWITCH (SECOND SWITCH)
50 COMMON TERMINAL
51 to 55 SELECTION TERMINAL
6 SWITCH (THIRD SWITCH)
60 COMMON TERMINAL
61 to 65 SELECTION TERMINAL
10 IC CHIP (SEMICONDUCTOR CHIP)
10a IC CHIP
11 POWER AMPLIFIER
111 DRIVER STAGE AMPLIFIER
112 OUTPUT STAGE AMPLIFIER
113 INTER-STAGE MATCHING CIRCUIT
114 CIRCUIT ELEMENT (INDUCTOR)
12A, 12B, 12C, 12D, 12E TRANSMISSION FILTER
13 OUTPUT MATCHING CIRCUIT
131 CIRCUIT ELEMENT (INDUCTOR)
14 CONTROLLER
148 TERMINAL
20 IC CHIP
21 LOW NOISE AMPLIFIER
22A, 22B, 22C, 22D, 22E RECEPTION FILTER
32A, 32B, 32C, 32D, 32E DUPLEXER
80 EXTERNAL CONNECTION TERMINAL
81 ANTENNA TERMINAL
82 SIGNAL INPUT TERMINAL
83 SIGNAL OUTPUT TERMINAL
84 CONTROL TERMINAL
85 GROUND TERMINAL
86 HEAT DISSIPATION TERMINAL
9 MOUNTING SUBSTRATE
91 FIRST MAIN SURFACE
92 SECOND MAIN SURFACE
93 OUTER PERIPHERAL SURFACE
94 THROUGH-ELECTRODE
95 FIRST CORNER PORTION
96 SECOND CORNER PORTION
97 THIRD CORNER PORTION
98 FOURTH CORNER PORTION
101 FIRST RESIN LAYER
1011 MAIN SURFACE
1013 OUTER PERIPHERAL SURFACE
102 SECOND RESIN LAYER
1021 MAIN SURFACE
1023 OUTER PERIPHERAL SURFACE
300 COMMUNICATION DEVICE
301 SIGNAL PROCESSING CIRCUIT
302 RF SIGNAL PROCESSING CIRCUIT
303 BASEBAND SIGNAL PROCESSING CIRCUIT
310 ANTENNA
D1 THICKNESS DIRECTION
Tx1 SIGNAL PATH

Rx1 SIGNAL PATH
Vcc1 FIRST POWER SUPPLY TERMINAL
Vcc2 SECOND POWER SUPPLY TERMINAL

The invention claimed is:

1. A high-frequency module comprising:
an antenna terminal;
an input terminal;
a second switch connected between the antenna terminal and the input terminal;
a power amplifier connected between the second switch and the input terminal; and
a mounting substrate having a first main surface and a second main surface on opposite sides of the mounting substrate, wherein
the power amplifier includes
a driver stage amplifier and an output stage amplifier,
the driver stage amplifier and the second switch are arranged on the second main surface of the mounting substrate, and
the output stage amplifier is arranged on the first main surface of the mounting substrate, and
the driver state amplifier and the second switch are including in one semiconductor chip.

2. The high-frequency module according to claim 1, wherein
from a plan view from a thickness direction of the mounting substrate, the output stage amplifier and the driver stage amplifier do not overlap each other.

3. The high-frequency module according to claim 2, further comprising:
an inductor connected between the driver stage amplifier and the output stage amplifier,
wherein the inductor is arranged on the first main surface of the mounting substrate.

4. The high-frequency module according to claim 3, wherein from the plan view, the inductor overlaps the semiconductor chip.

5. The high-frequency module according to claim 4, wherein from the plan view, the inductor overlaps the driver stage amplifier.

6. The high-frequency module according to claim 5, wherein the driver stage amplifier is the semiconductor chip including a silicon substrate, and the output stage amplifier is a semiconductor chip including a gallium arsenide substrate.

7. The high-frequency module according to claim 6, wherein the second switch is a band select switch.

8. The high-frequency module according to claim 7, further comprising:
a first switch connected between the antenna terminal and the second switch,
wherein the first switch is arranged on the second main surface of the mounting substrate.

9. The high-frequency module according to claim 1, further comprising:
a heat dissipation terminal that is arranged on the second main surface of the mounting substrate, wherein
from the plan view, overlaps the output stage amplifier, and
the mounting substrate further comprising a through-electrode that connects the output stage amplifier and the heat dissipation terminal.

10. The high-frequency module according to claim 9, wherein
from the plan view, there is no circuit component that is arranged on the second main surface of the mounting substrate and overlaps the output stage amplifier.

11. The high-frequency module according to claim 1, further comprising:
an electronic component is a controller that controls the power amplifier.

12. The high-frequency module according to claim 1, further comprising:
a plurality of transmission filters having different pass bands from each other;
a switch having a common terminal connected to the output stage amplifier and a plurality of selection terminals connected to a respective one of the plurality of transmission filters on a one-to-one basis; and
an electronic component,
wherein the electronic component is a circuit element included in an output matching circuit provided between the output stage amplifier and the common terminal of the switch in a signal path for a transmission signal.

13. The high-frequency module according to claim 12, wherein the circuit element is an inductor.

14. The high-frequency module according to claim 2, wherein
from the plan view, an electronic component and the output stage amplifier are adjacent to each other.

15. The high-frequency module according to claim 1, further comprising:
a controller that controls the power amplifier;
a plurality of filters having different pass bands from each other; and
a switch having a common terminal connected to the output stage amplifier and a plurality of selection terminals connected to respective of the plurality of transmission filters on a one-to-one basis, wherein
the driver stage amplifier, the controller, and the switch are included in one semiconductor chip.

16. The high-frequency module according to claim 1, further comprising:
an integrated circuit (IC) chip arranged on the second main surface of the mounting substrate, the IC chip including a low noise amplifier, wherein
from the plan view, the output stage amplifier and the IC chip do not overlap each other.

17. The high-frequency module according to claim 16, further comprising:
a plurality of external connection terminals arranged on the second main surface of the mounting substrate, wherein
from the plan view, the plurality of external connection terminals includes a ground terminal located between the driver stage amplifier and the IC chip.

18. The high-frequency module according to claim 11, further comprising:
An integrated circuit (IC) chip arranged on the second main surface of the mounting substrate, the IC chip including a low noise amplifier; and
a plurality of external connection terminals arranged on the second main surface of the mounting substrate, wherein
from the plan view, the output stage amplifier and the IC chip do not overlap each other,
from the plan view, the plurality of external connection terminals includes a control terminal located between the driver stage amplifier and the IC chip, and
the controller controls the power amplifier based on a control signal acquired from the control terminal.

19. The high-frequency module according to claim 15, further comprising:
- an integrated circuit (IC) chip arranged on the second main surface of the mounting substrate, the IC chip including a low noise amplifier; and
- a plurality of external connection terminals arranged on the second main surface of the mounting substrate, wherein from the plan view,
- the output stage amplifier and the IC chip do not overlap each other, and the plurality of external connection terminals includes a control terminal located between the driver stage amplifier and the IC chip, and the controller controls the power amplifier based on a control signal acquired from the control terminal.

20. The high-frequency module according to claim 1, further comprising a controller that controls the power amplifier to perform an envelope tracking operation.

* * * * *